US008466368B2

(12) United States Patent
Masuda

(10) Patent No.: US 8,466,368 B2
(45) Date of Patent: Jun. 18, 2013

(54) HIGH-FREQUENCY DEVICE

(75) Inventor: Kazutoshi Masuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 13/229,056

(22) Filed: Sep. 9, 2011

(65) Prior Publication Data

US 2012/0125665 A1    May 24, 2012

(30) Foreign Application Priority Data

Nov. 19, 2010  (JP) ................ P2010-259005

(51) Int. Cl.
*H05K 1/00*    (2006.01)

(52) U.S. Cl.
USPC ............ 174/250; 174/262; 174/265; 174/266

(58) Field of Classification Search
USPC ......................................... 174/250, 260–266
See application file for complete search history.

(56) References Cited

U.S. PATENT DOCUMENTS

| 4,085,390 | A | * | 4/1978 | Standing ........................ 333/33 |
| 4,376,287 | A | * | 3/1983 | Sechi ........................... 257/668 |
| 4,768,004 | A | * | 8/1988 | Wilson ........................ 333/246 |
| 5,355,102 | A | * | 10/1994 | Kornrumpf et al. ............ 333/33 |
| 5,768,109 | A | * | 6/1998 | Gulick et al. ................. 361/794 |
| 5,872,545 | A | * | 2/1999 | Rammos ...................... 343/770 |
| 6,359,536 | B1 | * | 3/2002 | Sakamoto et al. ............. 333/246 |
| 2007/0164431 | A1 | * | 7/2007 | Lee et al. ...................... 257/737 |

FOREIGN PATENT DOCUMENTS

| JP | 2002-135011 | 5/2002 |
| JP | 2004-172342 | 6/2004 |

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A high-frequency device according to one embodiment includes: a plate-like first dielectric substrate; a plurality of surface electrodes for capacitors which are formed on a surface of the first dielectric substrate; a rear face electrode for the capacitors which is formed on a rear face of the first dielectric substrate; a second dielectric substrate which is laminated on the first dielectric substrate and has an opening portion through which a plurality of the surface electrodes are exposed; a transmission line which is formed on a surface of the second dielectric substrate; and a conductive member to connect a plurality of the surface electrodes to the transmission line. The first dielectric substrate is made of dielectric material having a first dielectric constant. The second dielectric substrate is made of dielectric material having a second dielectric constant. The first dielectric constant is higher than the second dielectric constant.

6 Claims, 4 Drawing Sheets

HIGH-FREQUENCY DEVICE

CROSS-REFERENCE TO RELATED APPLICATION

This application is based upon and claims the benefit of priority from the prior Japanese Patent Application No. 2010-259005, filed on Nov. 19, 2010, the entire contents of which are incorporated herein by reference.

FIELD

Embodiments relate to a high-frequency device.

BACKGROUND

A high-frequency semiconductor device has a high-frequency semiconductor element such as a field effect transistor (FET) and a matching device in a high-frequency package.

A matching device has a transmission line and a plurality of chip capacitors. The transmission line is provided on a surface of a dielectric substrate. The chip capacitor is composed of another dielectric substrate and electrodes which are respectively provided on the surface and the rear face of this dielectric substrate. And, the dielectric substrate on which the transmission line is formed and the chip capacitors are mounted on a sheet of a metal plate, the transmission line and the chip capacitors are electrically connected, respectively, and thereby the matching device is made up. In addition, the dielectric substrate on which the transmission line is formed and the chip capacitors are mounted on the metal plate using gold tin (AuSn).

In a matching device like this, if a circuit is composed of distributed constant, a circuit size becomes large and a circuit area of the matching circuit also becomes large, and thereby the area which the matching device occupies also becomes large. Since the dielectric substrate on which the transmission line is formed and the chip capacitors are different components, the number of the components required for composing the matching device is increased, and thereby after all the area which the matching device occupies becomes large.

In case that the area which the matching circuit occupies is large, a high-frequency package which encloses the matching circuit becomes large. The high frequency package has a problem that it cannot be made large without restriction because a resonance frequency is decided according to the wavelength to deal with. Moreover, from the difference between the coefficient of linear thermal expansion of the material of the package, and the coefficient of linear thermal expansion of the material of the matching device, after attaching the matching device to the package, a problem that the crack of the matching device and peeling of the matching device generates. The rate which the crack and peeling generate becomes high in proportion to the increase in area.

In addition, even in the case of a high-frequency device other than a matching device, in a conventional high-frequency device having a transmission line provided on a surface of a dielectric substrate and a plurality of chip capacitors, the number of components is large (Refer to JP, P2002-135011A). For this reason, the conventional high-frequency device has the same problem as the matching device.

DETAILED DESCRIPTION

A high-frequency device according to one embodiment includes: a plate-like first dielectric substrate; a plurality of surface electrodes for capacitors which are formed on a surface of the first dielectric substrate; a rear face electrode for the capacitors which is formed on a rear face of the first dielectric substrate; a second dielectric substrate which is laminated on the first dielectric substrate and has an opening portion through which a plurality of the surface electrodes are exposed; a transmission line which is formed on a surface of the second dielectric substrate; and a conductive member to connect a plurality of the surface electrodes to the transmission line. The first dielectric substrate has a first dielectric constant. The second dielectric substrate has a second dielectric constant. The first dielectric constant is higher than the second dielectric constant.

Hereinafter, high-frequency devices of embodiments will be described with reference to the drawings. In addition, in the following description, matching devices will be described as an example of the high-frequency devices.

First Embodiment

Figure 1:
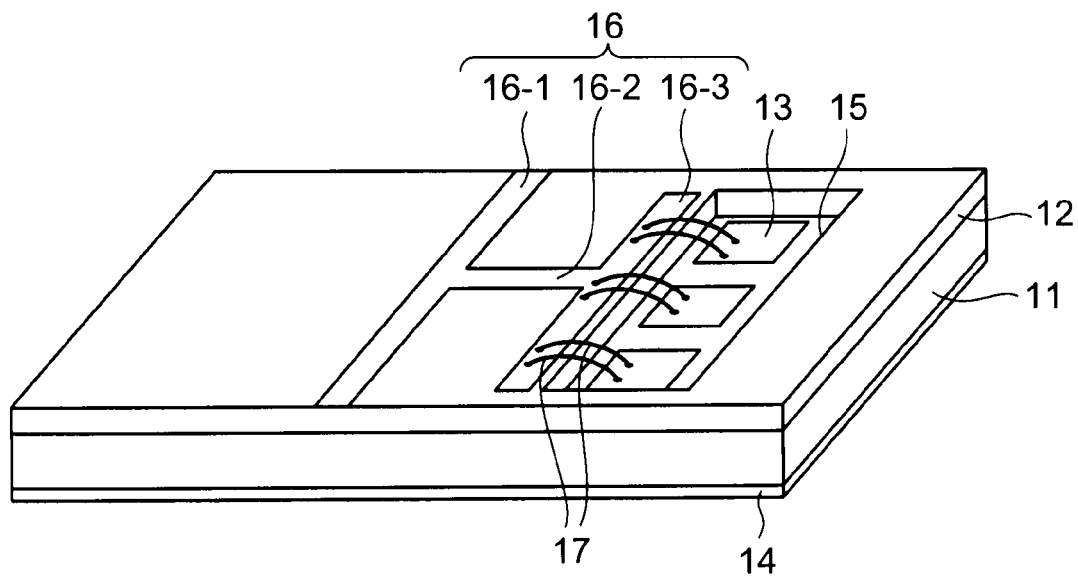
FIG. 1 is a perspective view showing schematically a matching device of a first embodiment.

FIG. 1 is a perspective view showing schematically a matching device of a first embodiment. The matching device has a first dielectric substrate 11 and a second dielectric substrate 12 which is laminated on the first dielectric substrate 11. The first dielectric substrate 11 is a high-dielectric-constant substrate and the second dielectric substrate 12 is a low-dielectric-constant substrate. The dielectric constant of the first dielectric substrate 11 is larger than the dielectric constant of the second dielectric substrate 12.

The first dielectric substrate 11 is a rectangular plate-like dielectric body. A plurality of surface electrodes 13 for capacitors are formed on the surface of the first dielectric substrate 11 at positions which are separate to each other. In addition, a rear face electrode 14 for the capacitors is formed at the whole rear face of the first dielectric substrate 11.

The capacitors are composed of the surface electrodes 13, the rear face electrode 14, and the first dielectric substrate 11 between these electrodes 13, 14. That is, a plurality of the surface electrodes 13 are formed on the surface of the plate-like first dielectric substrate 11 at the positions which are separate to each other, and the rear face electrode 14 is formed on the rear face of the first dielectric substrate 11 so that a plurality of the capacitors are integrated.

It is preferable that the first dielectric substrate 11 is made of a dielectric material having a high dielectric constant as much as possible. By this means, the capacitance of each capacitor can be made large, or a capacitor having a desired capacitance can be made small in size.

In addition, a plurality of electrodes (not shown) having the same areas as the areas of the surface electrodes 13 may be formed on the rear face of the first dielectric substrate 11 as the rear electrodes, at the positions facing the surface electrodes 13, respectively.

The second dielectric substrate 12 has a rectangular opening portion 15 so that a plurality of the surface electrodes 13 for the capacitors are exposed. In addition, the second dielectric substrate 12 is fixed on the first dielectric substrate 11 with solder, adhesive agent or the like (not shown).

A transmission line 16 for high-frequency use is formed on a surface of the second dielectric substrate 12. The transmission line 16 is an H-shaped transmission line having a first transmission line 16-1, a second transmission line 16-2 and a third transmission line 16-3. The transmission line 16 along with the rear face electrode 14 form a microstrip line.

The first transmission line 16-1 passes over the surface of the second dielectric substrate 12 from one side of the second dielectric substrate 12 to the other side facing this one side.

The second transmission line 16-2 has one end which contacts with the first transmission line 16-1 and the other end which contacts with the third transmission line 16-3, and is perpendicular to the first transmission line 16-1.

The third transmission line 16-3 is along one side of the opening portion 15 in the vicinity of the opening portion 15 and is approximately in parallel with the first transmission line 16-1.

It is preferable that the second dielectric substrate 12 is made of a dielectric material having a low dielectric constant as much as possible. It is preferable that the second dielectric substrate 12 is made of a dielectric material having a dielectric constant lower than the dielectric constant of the dielectric material forming the first dielectric substance 11, for example. By this means, the impedance of the transmission line 16 can be reduced, or the line width of the transmission line 16 having a desired impedance can be made wide.

The third transmission line 16-3 and the surface electrodes 13 for the capacitors are connected by a plurality of conductor wires 17 so that the capacitors are connected electrically in parallel with the third transmission line 16-3, respectively. These conductor wires 17 are gold wires, for example. That is, the surface electrodes 13 for the capacitors are connected to the third transmission line 16-3 with the conductive members.

This matching device is mounted, along with a FET chip and so on, for example, on a metal plate composing one portion of a high-frequency package, for example, using gold tin (AuSn). In this case, the matching device is used as an input matching device for the FET chip or as an output matching device for the FET chip. The electrode (gate electrode or drain electrode) of the FET chip and one end of the first transmission line 16-1 are connected with a conductor wire, and thereby the matching device and the FET chip are electrically connected.

In addition, in case that the above-described matching device is used as the input matching device or the output matching device for the FET chip, the matching device is formed so that the characteristic impedance of the matching circuit which is determined by the capacitances of the respective capacitors, the impedance of the transmission line 16, and the inductance of a plurality of conductor wires 17 which respectively connect the capacitors and the transmission line 16 is matched with the characteristic impedance of the FET chip.

Figure 2:
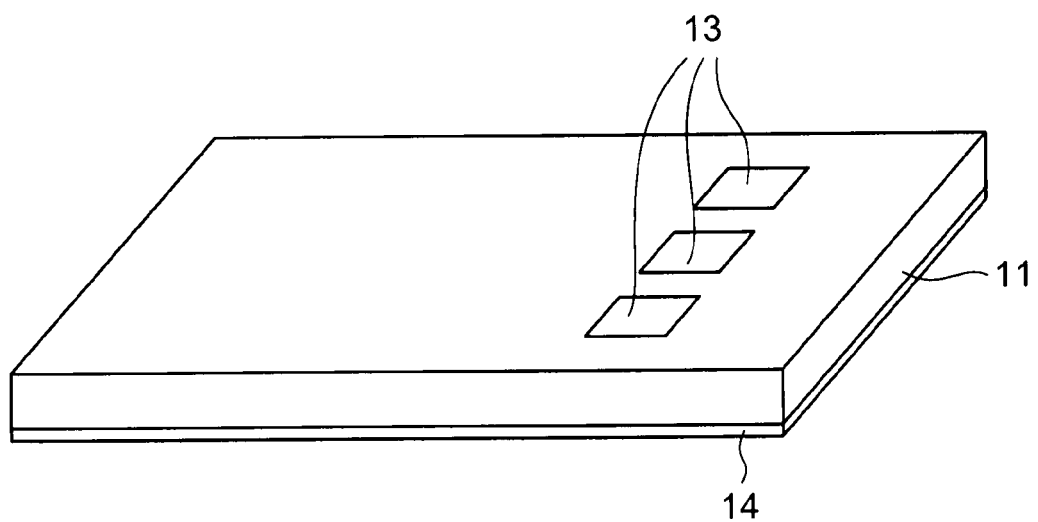
FIG. 2 is a perspective view to describe a manufacturing method of the matching device of FIG. 1.
Figure 3:
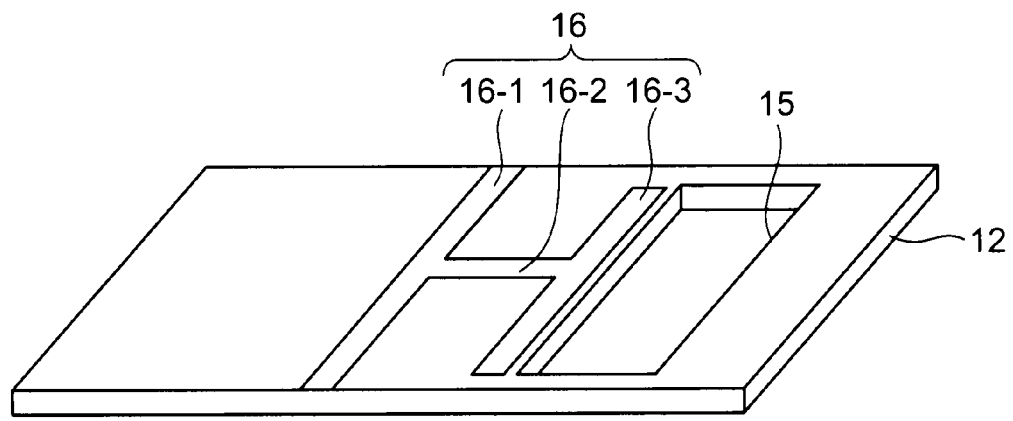
FIG. 3 is another perspective view to describe the manufacturing method of the matching device of FIG. 1.

Next, a manufacturing method of the matching device of the first embodiment shown in FIG. 1 will be described with reference to FIG. 2 and FIG. 3. FIG. 2 is a perspective view to describe the manufacturing method of the matching device of the first embodiment, and shows a process to form a plurality of the capacitors. And, FIG. 3 is a perspective view to describe the manufacturing method of the matching device of the first embodiment, and shows a process to form the transmission line.

To begin with, as shown in FIG. 2, a plurality of the surface electrodes 13 for the capacitors are formed on the surface of the rectangular plate-like first dielectric substrate 11 with metal films, respectively. In addition, the rear face electrode 14 for the capacitors is formed on the rear face of the first dielectric substrate 11 with a metal film.

A plurality of the surface electrodes 13 are formed with a known film forming method, such as a vapor deposition or sputtering using a mask. A plurality of the surface electrodes 13 are also formed by etching a metal film formed with a known film forming method. The rear face electrode 14 is also formed with a known film forming method. In addition, in case that two or more rear face electrodes 14 are formed like the surface electrodes 13, the rear face electrodes 14 are formed with the same method as the method to form the surface electrodes 13.

The rectangular opening portion 15 is previously provided in the rectangular plate-like second dielectric substrate 12, and the H-shaped transmission line 16 is formed on the surface of the second dielectric substrate 12.

The transmission line 16 is formed with a metal film, and is formed with the same method as the method to form the surface electrodes 13.

Next, the second dielectric substrate 12 is laminated on the first dielectric substrate 11 and is fixed. At this time, the second dielectric substrate 12 is laminated on the first dielectric substrate 11 and is fixed so that a plurality of the surface electrodes 13 formed on the first dielectric substrate 11 are exposed through the opening portion 15. In addition, the first dielectric substrate 11 and the second dielectric substrate 12 are fixed using solder, adhesive agent or the like (not shown) or by sintering.

Finally, the third transmission line 16-3 and the surface electrodes 13 for the capacitors are connected with a plurality of the conductor wires 17 so that the capacitors are connected electrically in parallel with the third transmission line 16-3, respectively.

With the above-described method, the matching device shown in FIG. 1 is manufactured.

In the matching device of the first embodiment which is shown above, the transmission line 16 and a plurality of the capacitors are integrated. Accordingly, in the matching device of the first embodiment, the number of the components composing the matching device can be made smaller than the conventional one. By this means, the matching device can be mounted on a metal plate composing a high-frequency package, for example, at one time using gold tin (AuSn), and an area which the matching device occupies can be small.

In addition, the conventional matching device has been formed by mounting a plurality of components one by one. Accordingly, the respective positions of the capacitors for the transmission line, and a position of certain capacitor for the other capacitors (the positions among the capacitors) varied depending on the mounting accuracy of each component. On the other hands, according to the matching device of the first embodiment, the variations in the respective positions of the capacitors (the surface electrodes 13 of the capacitors) for the transmission line 16, and the positions among the capacitors (among the surface electrodes 13 of the capacitors) depend on the position accuracy at the time of forming the transmission line 16 and the surface electrodes 13 of the capacitors. Ordinarily, compared with a mounting accuracy of the components, accuracy in patterning a metal film, for example, is higher. Accordingly, in the high-frequency device of the first embodiment, compared with conventional matching devices, the variations in the respective positions of the capacitors (the surface electrodes 13 of the capacitors) for the transmission line 16, and the positions among the capacitors (among the surface electrodes 13 of the capacitors) can be suppressed.

Second Embodiment

Figure 4:
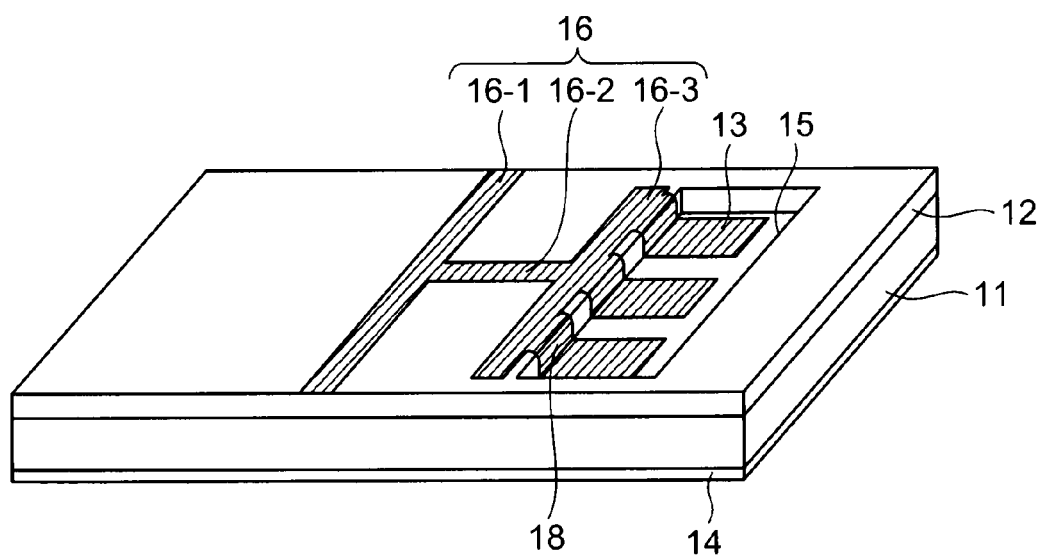
FIG. 4 is a perspective view showing schematically a matching device of a second embodiment.

FIG. 4 is a perspective view showing schematically a matching device of a second embodiment. The matching device of the second embodiment and the matching device of the first embodiment are different in the connection structure to electrically connect the third transmission line 16-3 and the surface electrodes 13 of the capacitors, respectively. In addition, the description of the similar portions as in the first embodiment will be omitted.

In the matching device of the second embodiment, the third transmission line 16-3 and the surface electrodes 13 of the capacitor are respectively connected with a metal film 18 for connection that is a conductive member. The metal film 18 for connection is formed so as to contact with a surface of the first dielectric substrate 11, a side wall of the opening portion 15 of the second dielectric substrate 12, and a surface of the second dielectric substrate 12.

In FIG. 4, the metal thin film 18 for connection is composed of a sheet of a metal film formed integrally with the transmission line 16 including the third transmission line 16-3 and a plurality of the surface electrodes 13 for the capacitors. But the transmission line 16, the surface electrodes 13 and the metal films 18 for connection may be composed of different metal films, respectively. In this case, the metal films 18 for connection are formed so as to cover at least a part of the transmission line 16 and a part of each surface electrode 13, respectively. In addition, any one of the transmission line 16 and the surface electrodes 13 may be formed integrally with the metal film 18 for connection.

In case that this matching device is used as the input matching device or the output matching device for the FET chip, the matching device is formed so that the characteristic impedance of a matching circuit which is determined by the capacitances of the respective capacitors, the impedance of the transmission line 16, and the inductance of the metal thin film 18 for connection is matched with the characteristic impedance of the FET chip.

Figure 5:
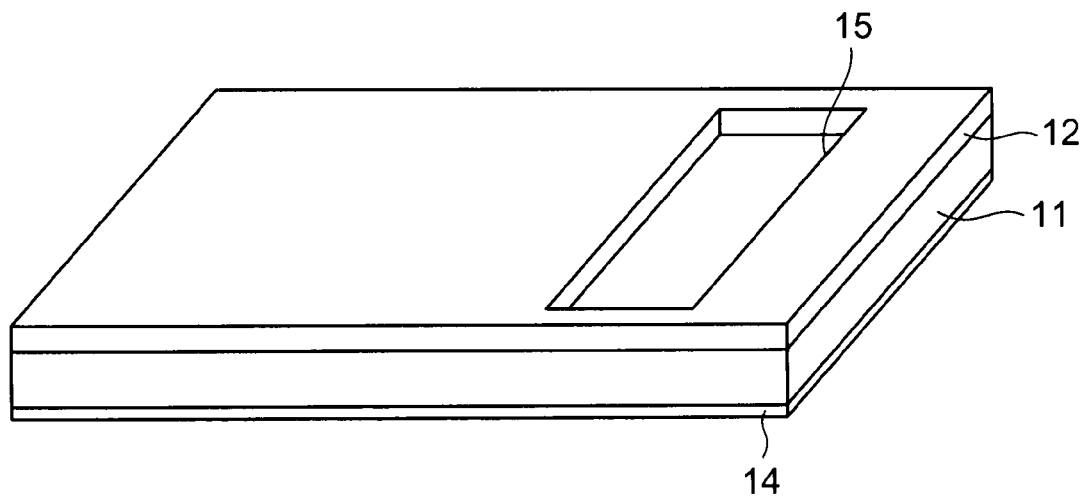
FIG. 5 is a perspective view to describe a manufacturing method of the matching device of FIG. 4.

Next, a manufacturing method of the matching device of the second embodiment shown in FIG. 4 will be described with reference to FIG. 5. FIG. 5 is a perspective view to describe the manufacturing method of the matching device of the second embodiment, and shows a process to laminate the second dielectric substrate on the first dielectric substance.

To begin with, the rectangular plate-like second dielectric substrate 12 in which the rectangular opening portion 15 was previously formed is laminated on the rectangular plate-like first dielectric substrate 11 having the rear face on which the rear face electrode 14 was previously provided, and is fixed Next, on the first dielectric substrate 11 which is exposed through the opening portion 15, and on the second dielectric substrate 12, the transmission line 16, a plurality of the surface electrodes 13 for the capacitors, and the metal film 18 for connection to electrically connect between them are formed collectively with metalizing, for example.

With the above-described method, the matching device shown in FIG. 4 is manufactured.

Similarly to the matching device of the first embodiment, the transmission line 16 and a plurality of the capacitors are integrated in the matching device of the second embodiment. Accordingly, in the matching device of the second embodiment, the number of the components composing the matching device can also be reduced than the conventional one. By this means, the matching device can be mounted on a metal plate composing a high-frequency package at one time, for example.

In addition, similarly to the matching device of the first embodiment, in the matching device of the second embodiment, the variations in the respective positions of the capacitors (the surface electrodes 13 of the capacitors) for the transmission line 16, and the positions among the capacitors (among the surface electrodes 13 of the capacitors) can be suppressed.

In addition, in the matching device of the second embodiment, the transmission line 16, a plurality of the surface electrodes 13 for the capacitors, and a plurality of the metal thin films 18 for connection are formed collectively. Accordingly, compared with the matching device of the first embodiment, the matching device of the second embodiment can be manufactured at a shorter time.

In addition, according to the matching device of the second embodiment, the position accuracy of the capacitors (the surface electrodes 13 of the capacitors) for the transmission line 16 is improved, compared with the matching device of the first embodiment.

Third Embodiment

Figure 6:
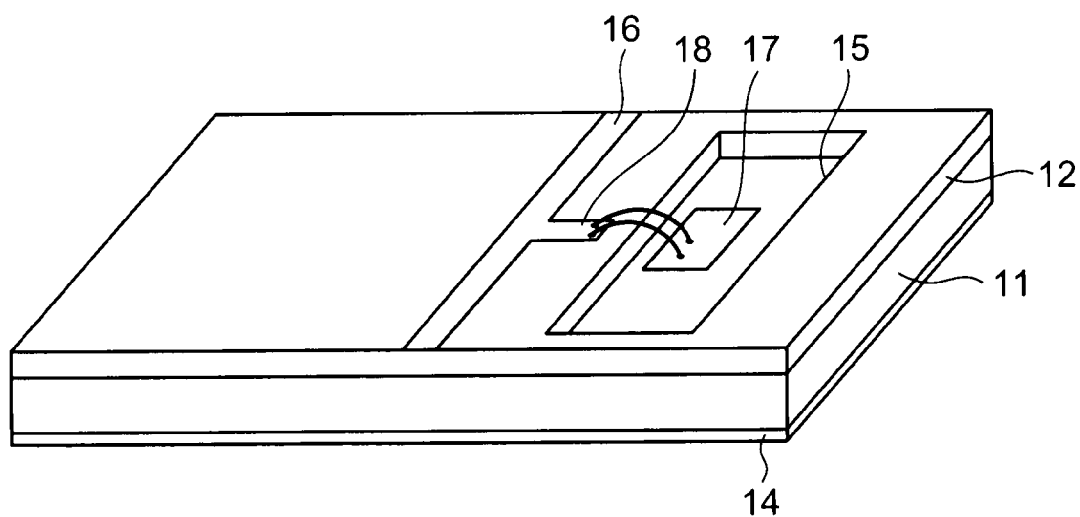
FIG. 6 is a perspective view showing schematically a matching device of a third embodiment.

FIG. 6 is a perspective view showing schematically a matching device of a third embodiment. The matching device of the third embodiment and the matching device of the first embodiment are different in circuit configuration. That is, in the first embodiment, the matching device is composed of a lumped-constant circuit, and surface electrodes 13 for capacitors are formed. In the matching device of the third embodiment, a circuit is composed of a distributed constant circuit. In addition, the description of the similar portions as in the first embodiment will be omitted.

In the matching device of the first embodiment, the capacitor was formed by a lumped constant. In the lumped constant circuit, it becomes impossible to disregard the influence of parasitic capacitance or parasitic inductance, depending on a wavelength. In order to solve this, a circuit is formed by a distributed constant. A pattern of an open stub 17 is formed on the surface of the first dielectric substrate 11 which is made of dielectric material having a higher dielectric constant, and thereby a circuit can be made small by the effect of wavelength shortening. In addition, depending on a wavelength of high-frequency wave which propagates the top of a dielectric substrate, a pattern of an open stub 18 may be formed on the surface of the second dielectric substrate 12 instead of the open stub 17. Moreover, both stubs 17, 18 may be combined.

Fourth Embodiment

Figure 7:
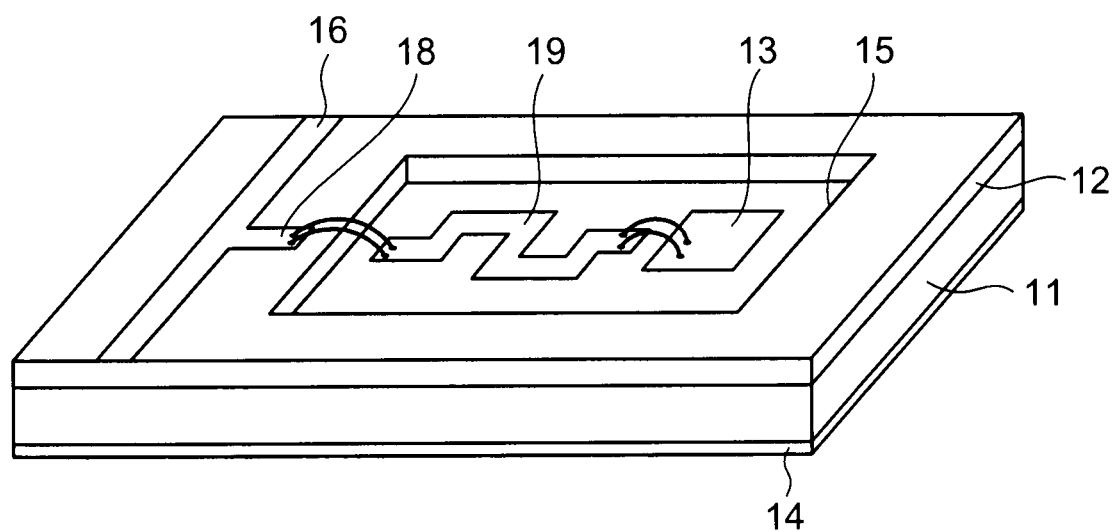
FIG. 7 is a perspective view showing schematically a matching device of a fourth embodiment.

FIG. 7 is a perspective view showing schematically a matching device of a fourth embodiment. The matching device of the fourth embodiment and the matching device of the third embodiment are different in circuit elements used. In addition, the description of the similar portions as in the third embodiment will be omitted. In the matching device of the fourth embodiment, a short stub 19 is formed on the surface of the first dielectric substrate 11. The short stub 19 is combined with a capacitor, in order to short-circuit the short stub 19 in high frequency and to make it open in direct current. The short stub 19 is connected to a capacitor electrode 13. Like the third embodiment, a pattern of the short stub 19 is formed on the surface of the first dielectric substrate 11 so that a circuit becomes small in size by the effect of wavelength shortening.

According to at least one of the above-described embodiments, the matching device can reduce the number of the components thereof.

While certain embodiments have been described, those embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In each of the above-described embodiments, a matching device has been described as a high-frequency device, but the present invention is not limited to a matching device. The present invention can be applied to a high-frequency device having the transmission line 16 and a capacitor.

What is claimed is:

1. A high-frequency device, comprising:
   a plate-like first dielectric substrate having a first dielectric constant;
   a plurality of surface electrodes for capacitors which are formed on a surface of the first dielectric substrate;
   a rear face electrode for the capacitors which is formed on a rear face of the first dielectric substrate;
   a second dielectric substrate which has a second dielectric constant, is laminated on the first dielectric substrate and has an opening portion through which a plurality of the surface electrodes are exposed, and the first dielectric constant is higher than the second dielectric constant;
   a transmission line which is formed on a surface of the second dielectric substrate; and
   a conductive member to connect a plurality of the surface electrodes to the transmission line.

2. The high-frequency device as recited in claim 1, wherein:
   the conductive member is composed of conductor wires.

3. The high-frequency device as recited in claim 1, wherein:
   the conductive member is a metal film.

4. The high-frequency device as recited in claim 1, wherein:
   the conductive member is a metal film formed integrally with a plurality of the surface electrodes and the transmission line 5. The high-frequency device as recited in claim 1, wherein:
   the rear face electrode and the transmission line compose a microstrip line.

6. A high-frequency device, comprising:
   a plate-like first dielectric substrate having a first dielectric constant;
   a surface electrode for a distributed constant circuit which is formed on a surface of the first dielectric substrate;
   a rear face electrode for the distributed constant circuit which is formed on a rear face of the first dielectric substrate;
   a second dielectric substrate which has a second dielectric constant, is laminated on the first dielectric substrate and has an opening portion through which the surface electrode is exposed, and the first dielectric constant is higher than the second dielectric constant;
   a transmission line which is formed on a surface of the second dielectric substrate; and
   a conductive member to connect the surface electrode to the transmission line.

* * * * *